(12) United States Patent
Pei et al.

(10) Patent No.: US 11,538,729 B2
(45) Date of Patent: Dec. 27, 2022

(54) SEMICONDUCTOR DEVICE, SEMICONDUCTOR CHIP AND METHOD OF MANUFACTURING SEMICONDUCTOR DEVICE

(71) Applicant: DYNAX SEMICONDUCTOR, INC., Kunshan (CN)

(72) Inventors: Yi Pei, Kunshan (CN); Guochun Kang, Kunshan (CN); Linlin Sun, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 149 days.

(21) Appl. No.: 16/760,786

(22) PCT Filed: Apr. 25, 2019

(86) PCT No.: PCT/CN2019/084222
§ 371 (c)(1),
(2) Date: Apr. 30, 2020

(87) PCT Pub. No.: WO2019/206215
PCT Pub. Date: Oct. 31, 2019

(65) Prior Publication Data
US 2020/0328133 A1    Oct. 15, 2020
US 2021/0280488 A9    Sep. 9, 2021

(30) Foreign Application Priority Data

Apr. 26, 2018  (CN) .......................... 201810383833.9

(51) Int. Cl.
*H01L 29/423*    (2006.01)
*H01L 29/66*    (2006.01)
(Continued)

(52) U.S. Cl.
CPC ...... *H01L 23/367* (2013.01); *H01L 21/28114* (2013.01); *H01L 29/42356* (2013.01);
(Continued)

(58) Field of Classification Search
CPC ....... H01L 2029/7858; H01L 21/28114; H01L 21/823437–823456;
(Continued)

(56) References Cited

U.S. PATENT DOCUMENTS 8,667,443 B2 * 3/2014 Smayling ............... G06F 30/394
716/122
9,418,994 B1 * 8/2016 Chao ............... H01L 21/823431
(Continued)

FOREIGN PATENT DOCUMENTS

CN    102129481 A    7/2011
CN    102270659 A    12/2011
(Continued)

OTHER PUBLICATIONS

PCT International Search Report, Application No. PCT/CN2019/084222, dated Jul. 2, 2019, 5 pages: with English translation.
(Continued)

*Primary Examiner* — Maliheh Malek
(74) *Attorney, Agent, or Firm* — Armstrong Teasdale LLP

(57) ABSTRACT

Embodiments of the disclosure provide a semiconductor device, a semiconductor chip and a method of manufacturing a semiconductor device, wherein the semiconductor device, includes a substrate, a semiconductor layer formed on the substrate, a plurality of gates, drains, and a plurality of sources formed on a side of the semiconductor layer away from the substrate, the gates located between the sources and the drains, and the gates, sources, and drains located in an active region of the semiconductor device, wherein a gate pitch is formed between any two adjacent gates, the formed
(Continued)

respective gate pitches include at least two unequal gate pitches, the maximum gate pitch of the respective gate pitches is within a first preset range determined according to a pitch of two gates at the two outermost ends in the semiconductor device in the gate length direction and a total number of gates of the semiconductor device.

19 Claims, 10 Drawing Sheets

(51) Int. Cl.
    *H01L 29/778*     (2006.01)
    *H01L 21/28*     (2006.01)
    *H01L 23/367*     (2006.01)
    *H01L 29/49*     (2006.01)

(52) U.S. Cl.
    CPC ...... *H01L 29/66462* (2013.01); *H01L 29/778* (2013.01); *H01L 29/49* (2013.01)

(58) Field of Classification Search
    CPC ............ H01L 21/823828–82385; H01L 27/11585–11597; H01L 29/42312–42392; H01L 29/49–4991; H01L 29/66515; H01L 29/66545; H01L 29/66787–66818; H01L 29/78391
    See application file for complete search history.

(56) References Cited

U.S. PATENT DOCUMENTS

| | | | | |
|---|---|---|---|---|
| 9,466,534 | B1* | 10/2016 | Brink | H01L 29/16 |
| 9,754,878 | B2* | 9/2017 | Kornachuk | G06F 30/39 |
| 9,842,931 | B1* | 12/2017 | Anderson | H01L 21/3086 |
| 9,870,996 | B1* | 1/2018 | Hung | H01L 21/76895 |
| 10,388,781 | B2* | 8/2019 | Bobde | H01L 29/7811 |
| 10,580,705 | B2* | 3/2020 | Blin | H01L 27/1203 |
| 11,309,423 | B2* | 4/2022 | Chen | H01L 21/823412 |
| 2005/0280031 | A1* | 12/2005 | Yano | H01L 27/11807 257/210 |
| 2007/0105387 | A1* | 5/2007 | Blatchford | H01L 21/28123 430/394 |
| 2008/0240194 | A1 | 10/2008 | Maeda et al. | |
| 2009/0166872 | A1* | 7/2009 | Chung | H01L 27/105 257/E23.164 |
| 2009/0309162 | A1* | 12/2009 | Baumgartner | H01L 29/785 257/E25.01 |
| 2010/0140665 | A1* | 6/2010 | Singbal | H01L 29/7786 438/129 |
| 2010/0155843 | A1* | 6/2010 | Mayer | H01L 29/7855 257/350 |
| 2011/0233612 | A1 | 9/2011 | Park et al. | |
| 2016/0247678 | A1* | 8/2016 | Feng | H01L 22/12 |
| 2017/0263454 | A1* | 9/2017 | Li | H01L 21/845 |
| 2018/0144993 | A1* | 5/2018 | Blin | H01L 23/66 |
| 2019/0067112 | A1* | 2/2019 | Liang | H01L 29/66545 |
| 2019/0067193 | A1* | 2/2019 | Juengling | H01L 21/76883 |
| 2019/0096811 | A1* | 3/2019 | Wang | H01L 23/535 |
| 2019/0096883 | A1* | 3/2019 | Chen | H01L 29/0649 |
| 2019/0148241 | A1* | 5/2019 | Chao | H01L 29/7848 438/283 |
| 2019/0348527 | A1* | 11/2019 | Liaw | H01L 21/823412 |
| 2019/0371795 | A1* | 12/2019 | Lin | H01L 21/76224 |
| 2020/0091320 | A1* | 3/2020 | Liaw | H01L 21/823437 |
| 2020/0266270 | A1* | 8/2020 | Ohnishi | H01L 29/7811 |
| 2021/0225657 | A1* | 7/2021 | Tu | H01L 21/823456 |
| 2021/0313323 | A1* | 10/2021 | Liaw | H01L 29/0692 |
| 2021/0399002 | A1* | 12/2021 | Trivedi | H01L 29/40117 |
| 2022/0012399 | A1* | 1/2022 | Peng | H01L 27/0207 |
| 2022/0059679 | A1* | 2/2022 | Liu | H01L 29/66818 |
| 2022/0300691 | A1* | 9/2022 | Lu | G06F 30/392 |

FOREIGN PATENT DOCUMENTS

| | | |
|---|---|---|
| CN | 104617092 A | 5/2015 |
| CN | 106815411 A | 6/2017 |
| CN | 107068739 A | 8/2017 |
| JP | 2004039657 A | 2/2004 |
| JP | 2006156902 A | 6/2006 |
| JP | 2017085061 A | 5/2017 |
| JP | 2017188685 A | 10/2017 |

OTHER PUBLICATIONS

PCT Written Opinion, Application No. PCT/CN2019/084222, dated Jul. 2, 2019, 6 pages.: with English translation of relevant part.
China First Office Action, Application No. 201810383833.9, 15 pps.: with English translation.
Japan Notice of Reasons for Refusal, Application No. 2020-524377, dated Dec. 13, 2021, 16 pps.: with English translation.

* cited by examiner

SEMICONDUCTOR DEVICE, SEMICONDUCTOR CHIP AND METHOD OF MANUFACTURING SEMICONDUCTOR DEVICE

CROSS REFERENCE TO RELATED APPLICATIONS

This patent application is a National Stage Entry of PCT/CN2019/084222 filed on Apr. 25, 2019, which claims the benefit and priority of Chinese Patent Application No. 201810383833.9 filed on Apr. 26, 2018, the disclosures of which are incorporated by reference herein in their entirety as part of the present application.

BACKGROUND

The present disclosure relates to the field of microelectronic technology, and particularly to a semiconductor device, a semiconductor chip, and a method of manufacturing a semiconductor device.

Gallium Nitride High Electron Mobility Transistor (HEMT) has excellent characteristics such as high band gap width, high mobility, and is suitable for making devices of high temperature, high frequency, high voltage, and high power. It can be widely used in the field of radio frequency microwave and the field of power electronics, and is one of the current research hotspots in the field of semiconductor devices. However, during the use of a semiconductor device, uneven temperature distribution in the device results in that the device generates large amounts of heat and has low reliability, which further affects the output power of the device.

BRIEF DESCRIPTION

In view of the above, the present disclosure provides a semiconductor device, a semiconductor chip, and a method of manufacturing a semiconductor device, which can effectively solve the above problem.

One embodiment of the present disclosure provides a semiconductor device, including a substrate, a semiconductor layer formed on the substrate, and a plurality of gates, a plurality of drains, and a plurality of sources formed on a side of the semiconductor layer away from the substrate, the gates being located between the sources and the drains, and the gates, sources, and drains being located in an active region of the semiconductor device, wherein a gate pitch is formed between any two adjacent gates, the formed respective gate pitches include at least two unequal gate pitches, the maximum gate pitch of the respective gate pitches is within a first preset range determined according to a pitch of two gates at the two outermost ends in the semiconductor device in the gate length direction and a total number of gates of the semiconductor device.

Further, the first preset range is $(L/(n-1), L)$, where L is the pitch of two gates at the two outermost ends in the semiconductor device in the gate length direction, and n is the total number of gates of the semiconductor device.

Further, the minimum gate pitch of the respective gate pitches is within a second preset range determined according to a pitch of two gates at the two outermost ends in the semiconductor device in the gate length direction and a total number of gates of the semiconductor device, the second preset range is $(L/(n-1)^2, L/(n-1))$, where L is the pitch of two gates at the two outermost ends in the semiconductor device in the gate length direction, and n is the total number of gates of the semiconductor device.

Further, the maximum gate pitch is located between adjacent gates on both sides of the source, and the minimum gate pitch is located between adjacent gates on both sides of the drain.

Further, the maximum gate pitch is located at a center position of the active region, while other gate pitches are sequentially arranged in a direction from the center position of the active region to a position away from the center position, and all the other gate pitches are the minimum gate pitches.

Further, in a direction from a center position of the active region to a position away from the center position, the respective pitches between adjacent gates on both sides of the source decrease sequentially according to a first fixed value or a first change amount, and the respective pitches between adjacent gates on both sides of the drain decrease sequentially according to a second fixed value or a second change amount.

Further, a plurality of the gates are interconnected together through a gate pad located in a passive region of the semiconductor device, a plurality of the drains are interconnected together through a drain pad located in the passive region, and a plurality of the sources are respectively connected to a ground electrode located on a side of the substrate away from the semiconductor layer respectively through a plurality of through holes penetrating the substrate and the semiconductor layer.

Further, the respective gate pitches include at least two gate pitches which are the maximum gate pitch.

Further, the maximum gate pitch is located at a center position of the active region, and in a direction from the center position of the active region to a position away from the center position, two pitches of the maximum gate pitch and the minimum gate pitch are arranged alternately.

A second embodiment of the present disclosure further provides a semiconductor chip, wherein the semiconductor chip includes a plurality of semiconductor devices above, and the plurality of semiconductor devices are connected in parallel.

Further, a gate pitch between devices is formed between edge gates of any two adjacent semiconductor devices, and in a direction from the center position of the active region of the semiconductor chip to a position away from the center position, gate pitches between the respective devices decrease sequentially according to a third fixed value or a third change amount.

Further, the third fixed value or third change amount is less than or equal to twice of the maximum gate pitch inside the semiconductor devices in the semiconductor chip.

Further, a plurality of the semiconductor devices includes a center device located at the center of the active region and an edge device away from the center of the active region, and a center gate pitch of the edge device is different from an edge gate pitch of the center device, wherein the center gate pitch of the edge device is a gate pitch formed by two adjacent gates located at the center of the edge device, and the edge gate pitch of the center device is a gate pitch formed by any two adjacent gates away from the center of the center device.

Further, the center gate pitch of the center device is different from the center gate pitch of the edge device.

Further, in a direction from the center device to a position away from the center device, the center gate pitches of respective devices decrease sequentially according to a change amount or a fixed value.

A third embodiment of the present disclosure further provides a semiconductor chip, including a plurality of semiconductor devices, the plurality of semiconductor devices being connected in parallel, each semiconductor device including a plurality of gates, a plurality of drains, and a plurality of sources, the gates being located between the sources and the drains, wherein, in the semiconductor chip, a gate pitch is formed between any two adjacent gates, the formed respective gate pitches include at least two unequal gate pitches, the maximum gate pitch of the respective gate pitches is within a first preset range determined according to a pitch of two gates at the two outermost ends in the semiconductor chip in the gate length direction and a total number of gates of the semiconductor chip.

Further, in a plurality of the semiconductor devices, all gate pitches in at least one semiconductor device are equal.

Further, the edge gate pitches between a plurality of adjacent semiconductor devices are equal or decrease from the center of the active region to both ends.

A fourth embodiment of the present disclosure further provides a method of manufacturing a semiconductor device, including providing a substrate, forming a semiconductor layer on a side of the substrate, and forming a plurality of gates, a plurality of drains, and a plurality of sources on a side of the semiconductor layer away from the substrate, each gate being located between one of the sources and one of the drains, and the gates, sources, and drains being located in an active region of the semiconductor device, wherein a gate pitch is formed between any two adjacent gates, the formed respective gate pitches include at least two unequal gate pitches, the maximum gate pitch of the respective gate pitches is within a first preset range determined according to a pitch of two gates at the two outermost ends in the semiconductor device in the gate length direction and a total number of gates of the semiconductor device.

Compared with the prior art, the present disclosure provides a semiconductor device, a semiconductor chip, and a method of manufacturing a semiconductor device, wherein without increasing the volume of the semiconductor device, the gate pitch between adjacent gates in the semiconductor device is adjusted so that the temperature distribution during the use of the semiconductor device is more uniform, so as to reduce the heat loss of the device and increase the output power thereof. At the same time, the embodiments of the present disclosure have a simple structure, are easy for manufacturing, and are suitable for large-scale promotion.

In order to make the above-mentioned features and advantages of the present disclosure more comprehensible, example embodiments are described below in detail with reference to the accompanying drawings as follows.

BRIEF DESCRIPTION OF THE DRAWINGS

In order to describe the technical solutions of the embodiments of the present disclosure more clearly, drawings of the embodiments will be briefly described below. It should be understood that the following drawings only show some embodiments of the present disclosure and therefore should not be considered as limiting the scope. For those skilled in the art, without exercise of inventive skills, other related drawings can also be obtained based on these drawings.

DETAILED DESCRIPTION

Figure 1:
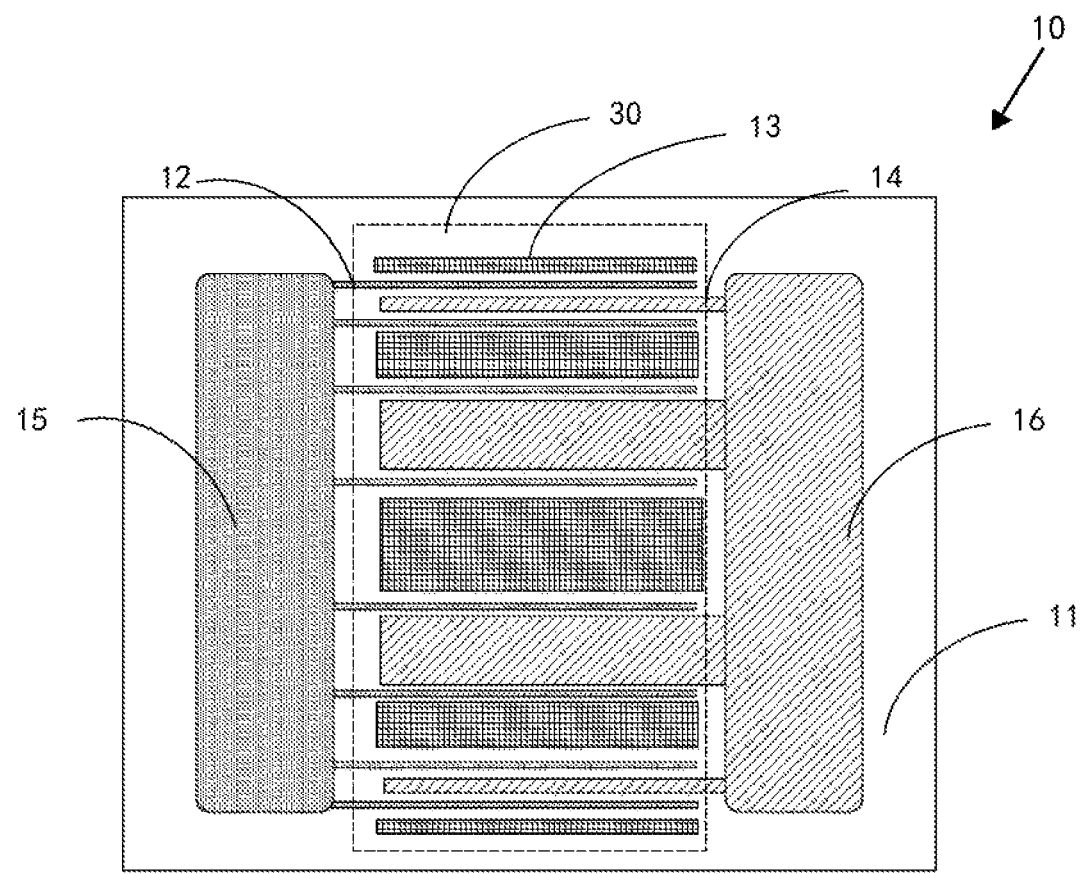
FIG. 1 is a top view of a semiconductor device provided by Embodiment one of the present disclosure.

In order to clarify the technical solution and advantages of the embodiments of the present disclosure, the technical solutions of the embodiments of the present disclosure will be clearly and completely described in conjunction with the drawings of the embodiments of the present disclosure below. Obviously, the embodiments to be described refer to a part of the embodiments of the present disclosure, other than all of the embodiments. Generally, components in the embodiments of the present disclosure described and shown herein in the accompanying drawings may be arranged and designed in various different configurations.

Therefore, the following detailed descriptions of the embodiments of the present disclosure provided in the accompanying drawings are not intended to limit the claimed scope of the present disclosure, and only indicate optional embodiments of the present disclosure. All other embodiments obtained by those skilled in the art based on the embodiments of the present disclosure without any creative work fall within the protection scope of the present disclosure.

It should be noted that similar reference signs and letters represent similar items in the following drawings and thus, once a certain item is defined in a drawing, it is not required to be further defined and explained in the following drawings. In the description of the present disclosure, terms "first", "second", "third", "fourth" and the like are only adopted for distinctive description and should not be understood to indicate or imply relative importance.

In the description of the present disclosure, unless specified or limited otherwise, the terms "mounted", "coupled", "connected" should be explained broadly, and may be, for example, fixed connections, detachable connections, or integral connections; may also be mechanical or electrical connections; may also be direct connections or indirect connections via intervening structures; may also be inner communications of two elements. Those skilled in the art can understand the real meanings of the terms in the present disclosure based on the particular condition.

In the prior art, in common semiconductor devices, the heat dissipation problem during the use of the semiconductor device is mainly solved in the following three ways.

(1) Using substrate materials with higher thermal conductivity for the manufacture of semiconductor devices; for instance, polishing off the silicon carbide substrate, and forming a diamond film or a diamond-like carbon film on the back of the epitaxial layer by Chemical Vapor Deposition (CVD), sputtering, or bonding etc. However, the disadvantage of such a method is increase in the process complexity and cost.

(2) Optimizing the packaging process; for instance, using a tube shell structure etc. with better heat dissipation effect. However, the disadvantage of such a method is that the temperature inside the semiconductor device cannot be effectively, uniformly and timely dissipated through the tube shell, resulting in the temperature at the center of the device still being the highest and the temperature inside the device still being unevenly distributed.

(3) Adjusting the gate pitch; for instance, while increasing the pitch between adjacent gates or reducing the length of the gates, increasing the gates to achieve the same net active region. However, such a method would cause the heat load generated in the center of the chip to spread in a wider range. Especially in a semiconductor chip composed of a plurality of semiconductor devices, this will result in a larger semiconductor chip area and reduce the number of chips per wafer.

In summary, the existing three heat dissipation solutions have certain limitations when solving the heat dissipation problem of semiconductor devices. In this regard, the inventor found through research that the heat of the existing semiconductor device is mainly generated in the active region of the device, especially the gate position, then, at the center of the active region of the semiconductor device, by increasing the lengths of the source ohms and drain ohms in the gate length direction, the distances between adjacent gate fingers are increased to reduce the distance between adjacent temperature peak points to achieve the purpose of improving the temperature distribution gradient, to improve the problem of heat dissipation at the center position of the semiconductor device. Specifically, it will be described in details in conjunction with different embodiments below.

Embodiment One

FIG. 1 is a top view of a semiconductor device provided by Embodiment one of the present disclosure. The semiconductor device 10 includes a substrate, a semiconductor layer 11, a plurality of gates 12, a plurality of drains 14, and a plurality of sources 13. The semiconductor layer 11 is located on one side of the substrate, and the plurality of gates 12, the plurality of drains 14, and the plurality of sources 13 are located on a side of the semiconductor layer 11 away from the substrate, the gates 12 are located between the sources 14 and the drains 13, and the plurality of gates 12, the plurality of drains 14, and the plurality of sources 13 are located in an active region 30 of the semiconductor device 10. Alternatively, the gate 12 may be, but not limited to, a stripe gate.

Further, during the use of the semiconductor device 10, since the position of the gate 12 is a region where the source leakage current and the electric field are concentrated and meanwhile is the center region where the semiconductor device 10 generates heat, the temperature at the position of the gate 12 is higher than the nearby position. In addition, the region of the gate 12 located at the center position of the active region 30 of the semiconductor device 10 is less likely to dissipate the generated heat in time to the outside of the device, so the center position of the semiconductor device 10 is the highest temperature point of the entire device. However, excessively high temperature at the center will greatly increase the heat loss of the device and reduce the output power of the device. With regards to the above problem, in the semiconductor device 10 given in Embodiment one, a gate pitch is formed between any two adjacent gates 12, the formed respective gate pitches include at least two unequal gate pitches, wherein the maximum gate pitch of the respective gate pitches is within a first preset range determined according to a pitch of two gates 12 at the two outermost ends in the semiconductor device 10 in the gate length direction and a total number of gates 12 of the semiconductor device 10. In Embodiment one, through the foregoing design of the semiconductor device 10, the temperature distribution in the semiconductor device 10 can be made more uniform, and the problem of failure of the semiconductor device 10 caused by excessively high temperature of the center of the device can be avoided. Meanwhile, the embodiment of the present disclosure may also effectively reduce the heat loss of the semiconductor device 10 and improve the reliability and output power thereof by adjusting the respective gate pitches in the semiconductor device 10.

Alternatively, in an embodiment, the first preset range is (L/(n−1), L), that is, the maximum gate pitch $L_{max}$ of the respective gate pitches satisfies the following condition:

$$\frac{L}{n-1} < L_{max} < L,$$

where L is the pitch of two gates 12 at the two outermost ends in the semiconductor device 10 in the gate length direction, and n is the total number of gates 12 of the semiconductor device 10, n being an integer greater than 2.

Figure 2:
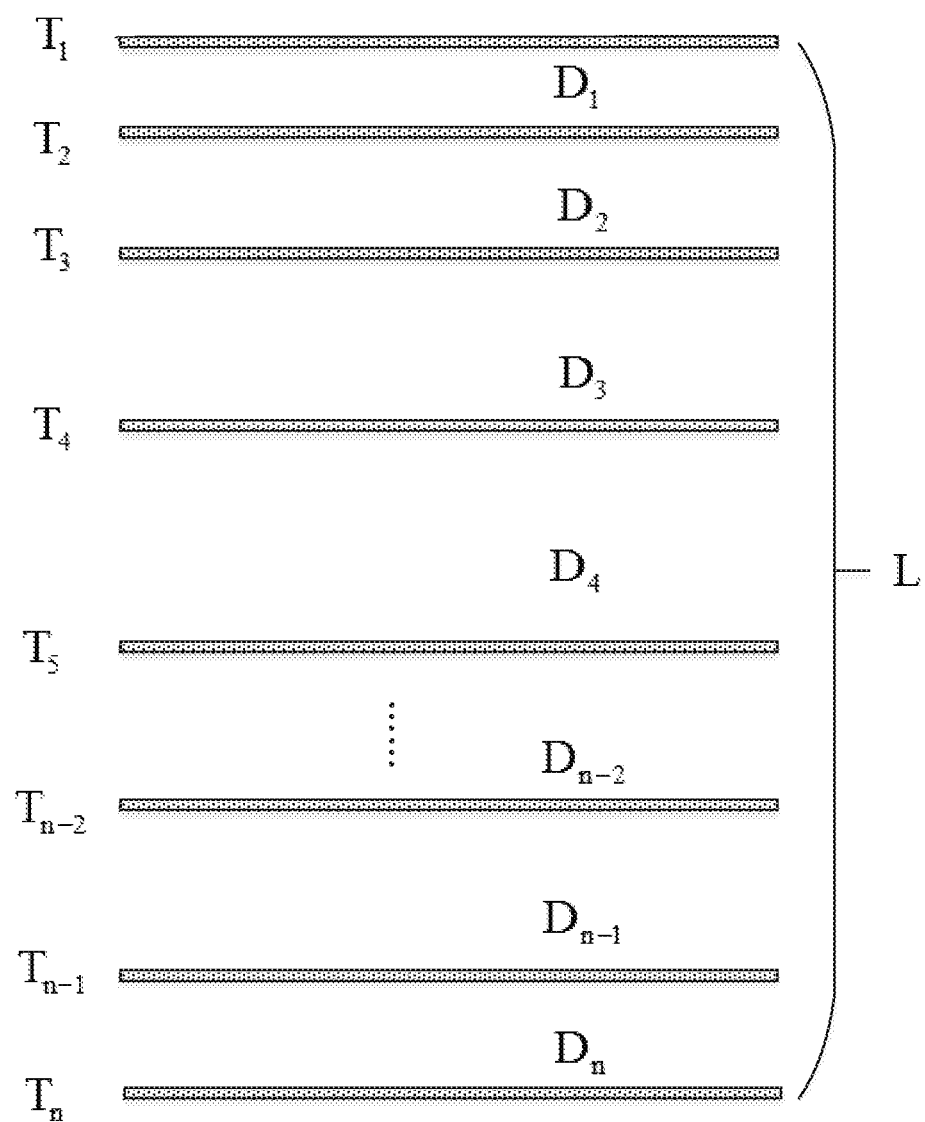
FIG. 2 is a schematic diagram of changes of the gate pitches in the semiconductor device in Embodiment one of the present disclosure.

Specifically, as shown in FIG. 2, assuming that the semiconductor device 10 includes n gates 12, which are $T_1$, $T_2$, $T_3$, $T_4$, $T_5$, ... $T_{n-2}$, $T_{n-1}$, $T_n$, respectively, the gate pitches formed between respective adjacent gates 12 are $D_1$, $D_2$, $D_3$, $D_4$, $D_5$, ... $D_{n-2}$, $D_{n-1}$, $D_n$; the pitch of two gates $T_1$ and $T_n$ at the two outermost ends in the semiconductor device 10 in the gate length direction is L, assuming that the maximum gate pitch of the respective gate pitches is $D_4$, the maximum gate pitch $D_4$ satisfies $$\frac{L}{n-1} < D_4 < L.$$

Preferably, considering the actual area utilization rate of the active region 30 of the device, the maximum gate pitch satisfies the following condition:

$$\frac{L}{n-1} < L_{max} < \frac{(n-1)L}{n}.$$

Further, referring to FIG. 2 again, the minimum gate pitch of the respective gate pitches is within a second preset range determined according to a pitch of two gates 12 at the two outermost ends in the semiconductor device 10 in the gate length direction and a total number of gates 12 of the semiconductor device 10, the second preset range is $(L/(n-1)^2, L/(n-1))$, that is, the minimum gate pitch $L_{min}$ satisfies the following condition:

$$\frac{L}{(n-1)^2} < L_{min} < \frac{L}{n-1},$$

where L is the pitch of two gates 12 at the two outermost ends in the semiconductor device 10 in the gate length direction, and n is the total number of gates 12 of the semiconductor device 10. Preferably, in order to reduce the difference between the highest temperature and the lowest temperature, and to balance the heat distribution of the entire device, the minimum gate pitch $L_{min}$ is greater than or equal to $L/2(n-1)$. Specifically, assuming that the minimum gate pitch of the respective gate pitches as shown in FIG. 2 is $D_1$, then the minimum gate pitch $D_1$ satisfies:

$$\frac{L}{(n-1)^2} < D_1 < \frac{L}{n-1}.$$

In another embodiment, in order to further meet the combination of the internal structure requirements of the device and the planar layout, the maximum gate pitch $L_{max}$ is located between adjacent gates 12 on both sides of the source 13, and the minimum gate pitch $L_{min}$ is located between adjacent gates 12 on both sides of the drain 14. Based on the setting of the gate pitch in the semiconductor device 10 above, on the premise of ensuring the reduction of the heat loss of the semiconductor device 10 and improving the reliability and output power thereof, there are various design forms of the respective gate pitches.

For instance, as shown in FIG. 2 again, the gate pitch $D_4$ of the respective gate pitches is the maximum, that is, the maximum gate pitch $L_{max}$ is between adjacent gates 12 on both sides of the source 13, the source 13 is located within $D_4$, the gate pitch $D_1$ is the minimum, and the drain 14 is located within $D_1$, that is, the minimum gate pitch $L_{min}$ is located between adjacent gates 12 on both sides of the drain 14, thus, other gate pitches may be set to be less than or equal to $D_4$, or greater than or equal to $D_1$, for instance, the respective gate pitches may include at least two gate pitches as the maximum gate pitch, or the respective gate pitches may include at least two gate pitches as the minimum gate pitch, etc.; the maximum gate pitch may be located at a center position of the active region 30, and in a direction from the center position of the active region 30 to a position away from the center position, two pitches of the maximum gate pitch and the minimum gate pitch are arranged alternately.

Figure 3:
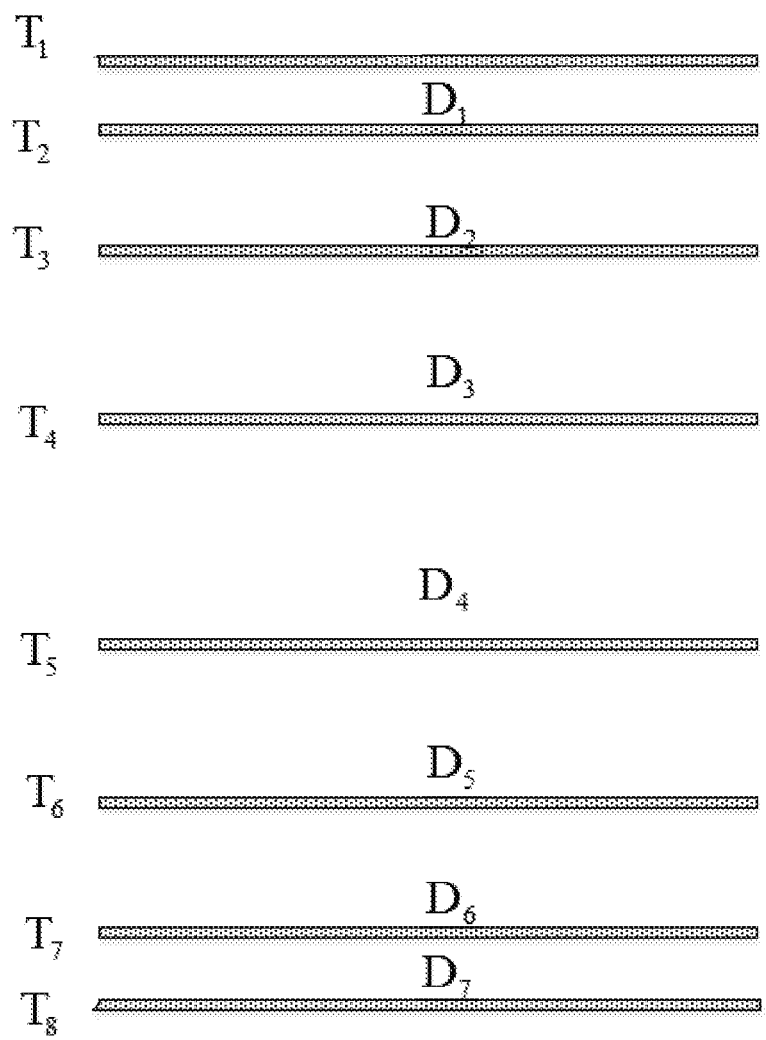
FIG. 3 is another schematic diagram of changes of the gate pitches in the semiconductor device in Embodiment one of the present disclosure.

For another instance, the plurality of gate pitches formed by the plurality of gates 12 may sequentially decrease in a direction from a center position of the active region 30 to a position away from the center position according to a change amount or a fixed value; for example, the differences between any two adjacent gate pitches may either be the same or substantially the same, or decrease sequentially according to an arbitrary value, which is not limited herein in Embodiment one. In addition, it can be understood that in Embodiment one, if there are an even number of gate pitches in the active region 30 of the semiconductor device 10, the two gate pitches located at the center position of the active region 30 are equal and other gate pitches away from the center position relatively decrease. Specifically, as shown in FIG. 3, assuming that the total number n of the gates 12 included in the semiconductor device 10 is 8, the two gates 12 at the center position of the active region 30 are $T_4$ and $T_5$, and the gate pitch $D_4$ between $T_4$ and $T_5$ is greater than the gate pitches formed by other adjacent gates 12 away from the center position. Accordingly, from the position where $D_4$ is located to the edge positions on both sides of the active region 30, the gate pitches may decrease sequentially according to a change amount or a fixed value; for instance, the difference between $D_3$ and $D_4$ is equal to the difference between $D_2$ and $D_1$, the difference between $D_2$ and $D_1$ is equal to the difference between $D_2$ and $D_3$, the difference between $D_4$ and $D_3$ is equal to the difference between $D_5$ and $D_6$, and so on.

For another instance, in the actual design of respective gate pitches, in order to effectively balance the heat distribution, in a direction from the center position of the active region 30 to a position away from the center position of a plurality of gate pitches formed by the plurality of gates 12, other gate pitches may be arranged at equal pitches in order in a direction from the center position of the active region 30 to a position away from the center position, where the equal pitch may be the minimum gate pitch, or the pitch value of the equal pitch arrangement may also be any pitch value greater than the minimum gate pitch and smaller than the maximum gate pitch.

Further, the substrate may be formed of one of sapphire, silicon carbide (SiC), silicon (Si), lithium niobate, silicon-on-insulator, gallium nitride (GaN), aluminum nitride (AlN), or any other material suitable for growing group III nitrides, which is not specifically limited in the present disclosure. The material of the semiconductor layer 11 may be, but not limited to, a group III nitride semiconductor material such as AlGaN, AlN, or InAlN.

In addition, a gate pad 15 and a drain pad 16 are provided in the passive region of the semiconductor device 10, and the gate pad 15 and the drain pad 16 are located on both sides of the active region 30, respectively. A plurality of the gates 12 are interconnected by the gate pad 15 located in the passive region of the semiconductor device 10, and a plurality of the drains 14 are interconnected by the drain pad 16 located in the passive region, wherein the gate pad 15 and the drain pad 16 may be, but not limited to, metal pads, which is not limited in this embodiment.

Alternatively, in the semiconductor chip 20, the gate pad 15, and the drain pad 16 located in the passive region may be jointly belong to the same semiconductor device 10, or may be provided by different semiconductor devices 10 together to constitute the semiconductor device 10 given in Embodiment one, that is, different semiconductor devices 10 may share a gate pad 15 or a drain pad 16, which is not specifically limited in Embodiment one.

Further, the semiconductor device 10 further includes a ground electrode located on a side of the substrate away from the semiconductor layer 11, and the plurality of sources 13 may be connected to the ground electrode located on a side of the substrate away from the semiconductor layer 11 through a plurality of through holes penetrating the substrate and the semiconductor layer 11, respectively.

Embodiment Two

Figure 4:
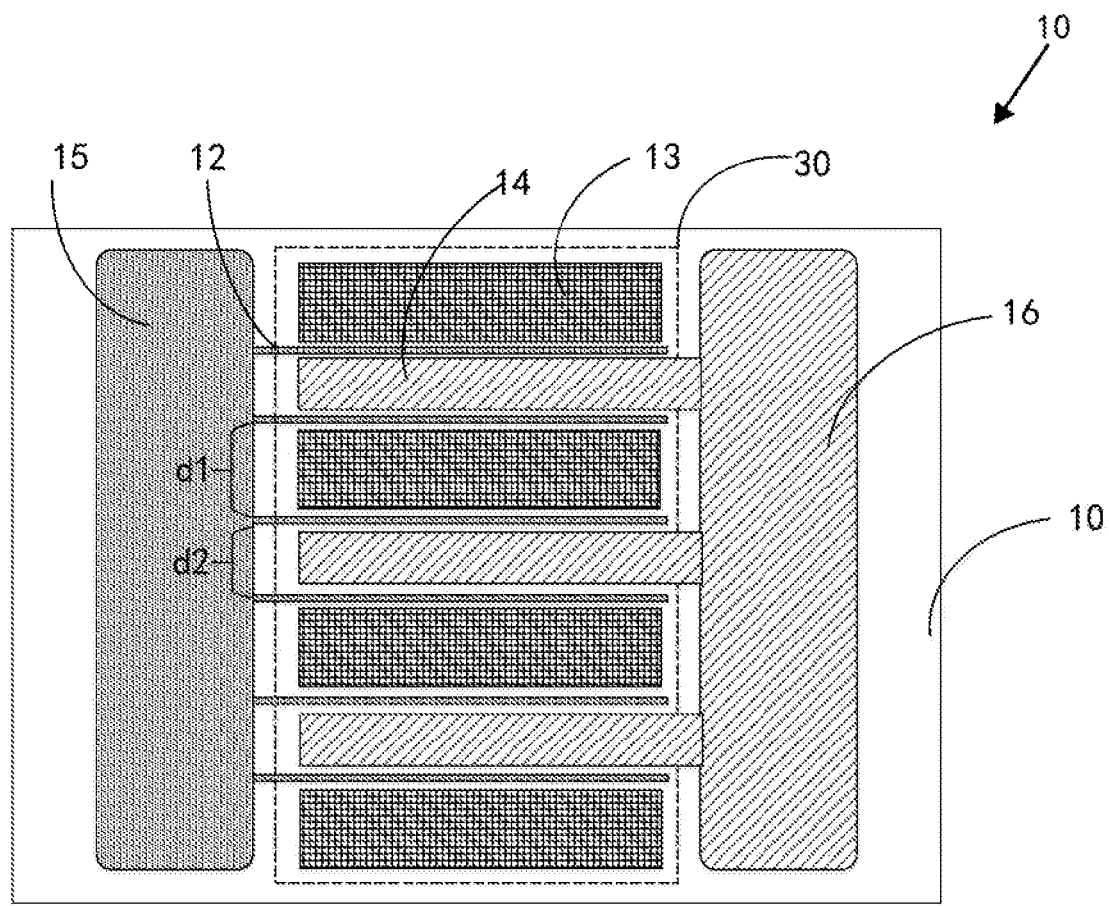
FIG. 4 is a top view of a semiconductor device provided by Embodiment two of the present disclosure.

In order to reduce the inductance and parasitic capacitance of the device, the source 13 needs to be provided with a through hole; therefore, the gate pitches on both sides of the adjacent source 13 and drain 14 are different. As shown in FIG. 4, the gate finger pitch of both sides of the source 13 is d1, and the gate finger pitch of both sides of the drain 14 is d2, generally, the gate pitches d1 and d2 of both sides of the adjacent source 13 and drain 14 satisfy d2≤d1≤3d2. In order to reduce device losses and effectively balance the heat distribution, the maximum gate pitch is located at the center position of the active region 30, in a direction from the center position of the active region 30 to a position away from the center position, the respective pitches between adjacent gates 12 on both sides of the source 13 decrease sequentially according to a first fixed value or a first change amount, and the respective pitches between adjacent gates 12 on both sides of the drain 14 decrease sequentially according to a second fixed value or a second change amount. The first fixed value or the first change amount is not equal to the second fixed value or the second change amount.

Embodiment Three

Figure 5:
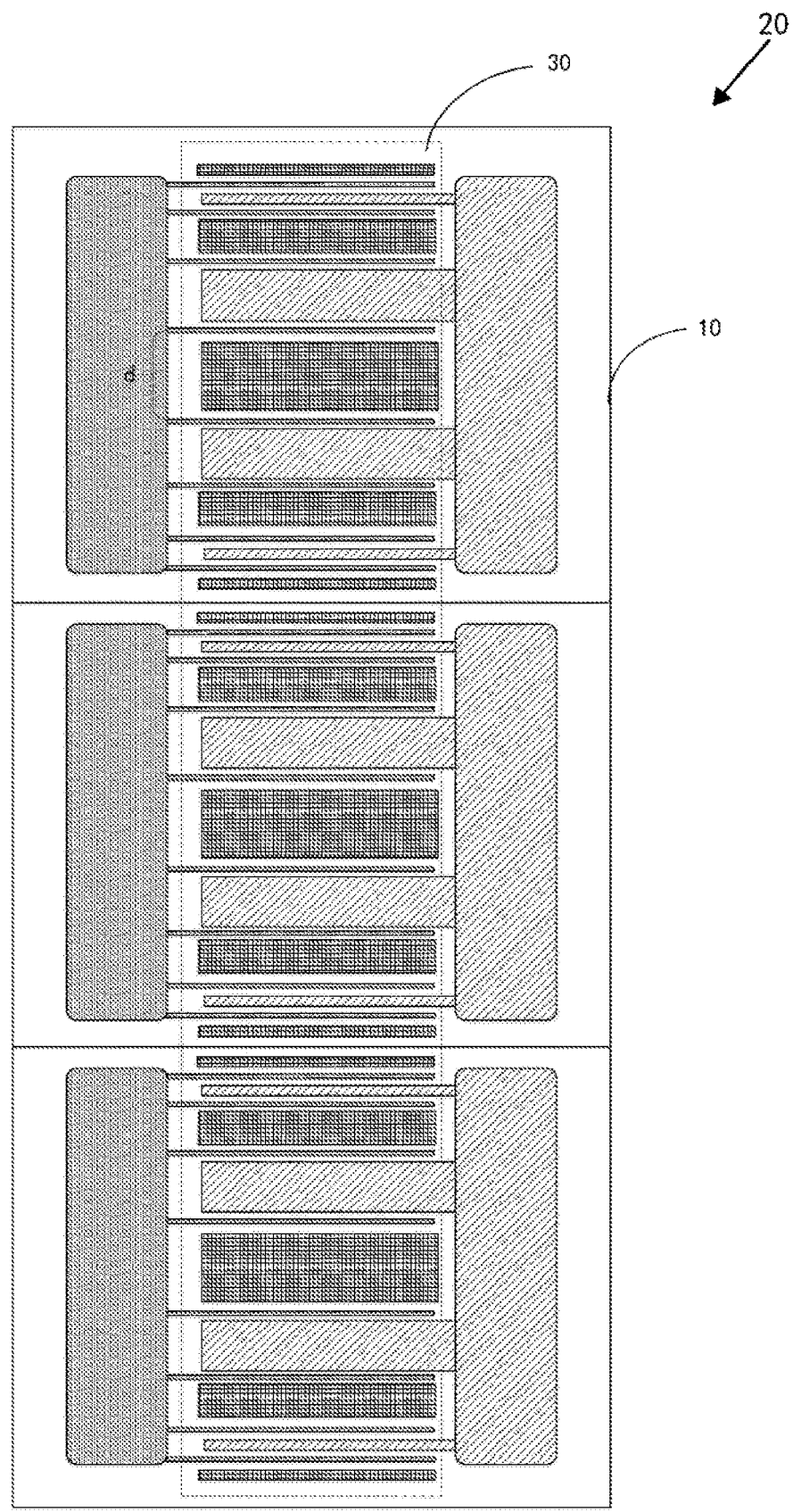
FIG. 5 is a top view of a semiconductor chip provided by Embodiment three of the present disclosure.

Based on the design and description of the semiconductor device 10 given in Embodiment one, as shown in FIG. 5, Embodiment three of the present disclosure further provides a semiconductor chip 20 including a plurality of semiconductor devices 10, and the plurality of semiconductor devices 10 are connected in parallel. A gate pitch between devices is formed between edge gates 12 of any two adjacent semiconductor devices 10 of the semiconductor chip 20, and the gate pitches between devices decrease sequentially according to a third fixed value or a third change amount. The setting of the gate pitch between the semiconductor devices 10 in the semiconductor chip 20 can effectively alleviate the heat generation between the device edges and balance the heat distribution of the entire chip. It should be understood that the semiconductor device 10 given in this embodiment has the same structural features as the semiconductor device 10 described in Embodiment one, so this embodiment will not repeat them.

Alternatively, in order to improve the heat distribution while obtaining a better chip layout, in an embodiment, the third fixed value or the third change amount is less than or equal to twice of the maximum gate pitch inside the semiconductor device 10 in the semiconductor chip 20. Alternatively, when the plurality of semiconductor devices 10 include a center device 40 located at the center of the active region 30 and an edge device 50 away from the center of the active region 30, the center gate pitch of the edge device 50 is defined as the gate pitch formed by two adjacent gates 12 at the center of the edge device 50, and the edge gate pitch of the center device 40 is defined as the gate pitch formed by any two adjacent gates 12 away from the center of the center device 40. Then, the center gate pitch of the edge device 50 is different from the edge gate pitch of the center device 40, for instance, the center gate pitch of the edge device 50 may be greater or smaller than the edge gate pitch of the center device 40, or the center gate pitch of the center device 40 is different from the center gate pitch of the edge device 50, for instance, the center gate pitch located at the center device 40 is greater than the center gate pitch of the edge device 50, or the center gate pitch of each edge device 50 decreases sequentially according to a change amount or a fixed value, and so on.

Embodiment Four

Figure 6:
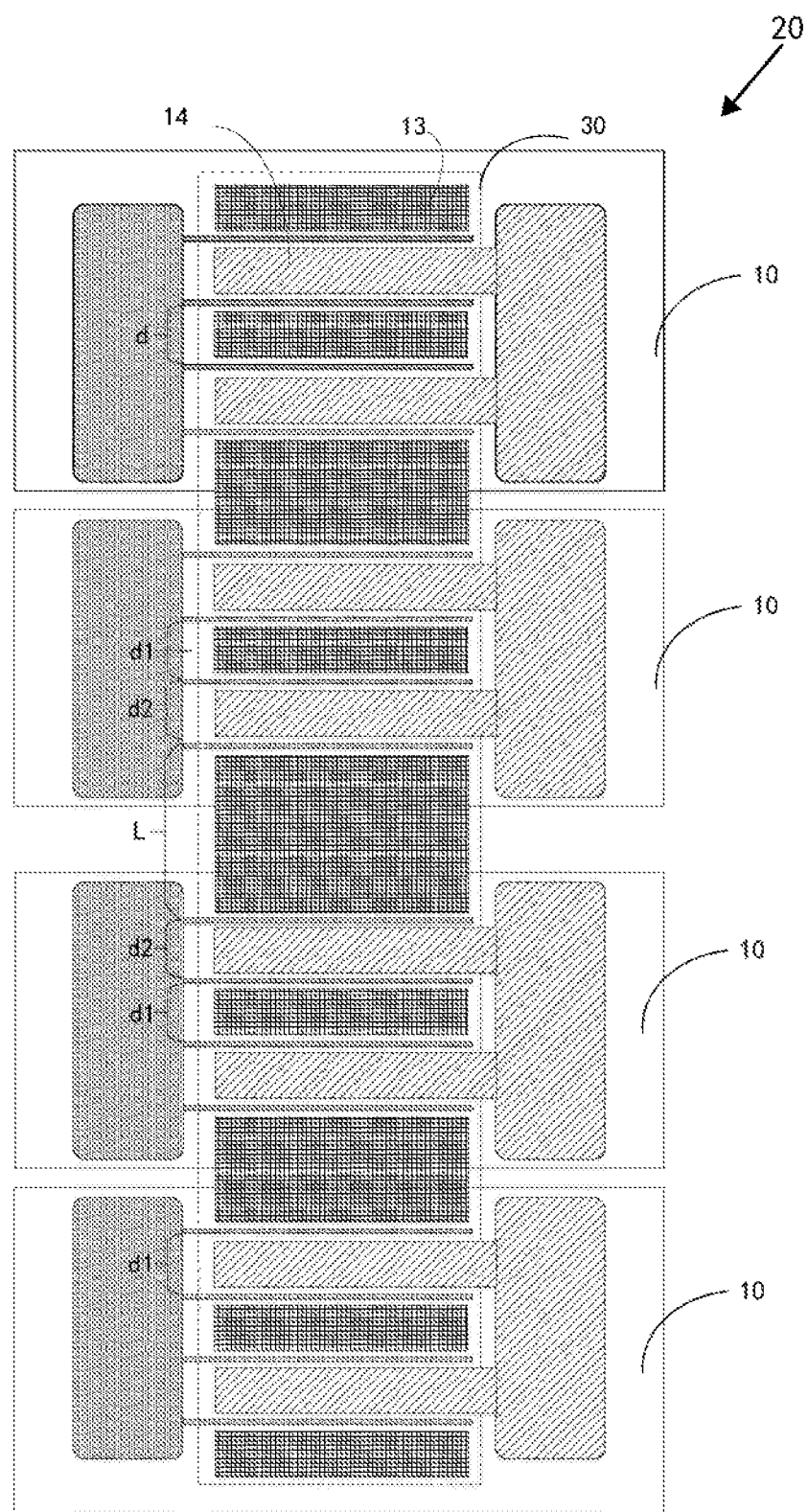
FIG. 6 is a top view of a semiconductor chip provided by Embodiment four of the present disclosure.

As shown in FIG. 6, Embodiment 4 of the present disclosure further provides a semiconductor chip 20 including a plurality of semiconductor devices 10, and the plurality of semiconductor devices 10 are connected in parallel. A gate pitch L between devices is formed between edge gates 12 of any two adjacent semiconductor devices 10 of the semiconductor chip 20. The distribution rule of the gate pitches inside the plurality of semiconductor devices 10 is the same; alternatively, the pitches of the gates 12 on both sides of the source 13 inside the semiconductor device 10 are equal and d1, the pitches of the gates 12 on both sides of the drain 14 inside the semiconductor device 10 are equal and d2, and they satisfy d2≤d1≤2d2 and are arranged alternately inside each semiconductor device 10. The distance L between the edge gates 12 of two adjacent semiconductor devices 10 at the center of the active region 30 of the semiconductor chip 20 is the largest, in a direction from the center position of the active region 30 of the semiconductor chip 20 to a position away from the center position, the gate pitches between devices gradually decrease, and ΔL≤2d1. In practical applications, the center loss of the active region 30 is adjusted according to the size of the chip, alternatively, at least two identical gate pitches between devices may be set near the center position of the active region 30 of the semiconductor chip 20.

Embodiment Five

Figure 7:
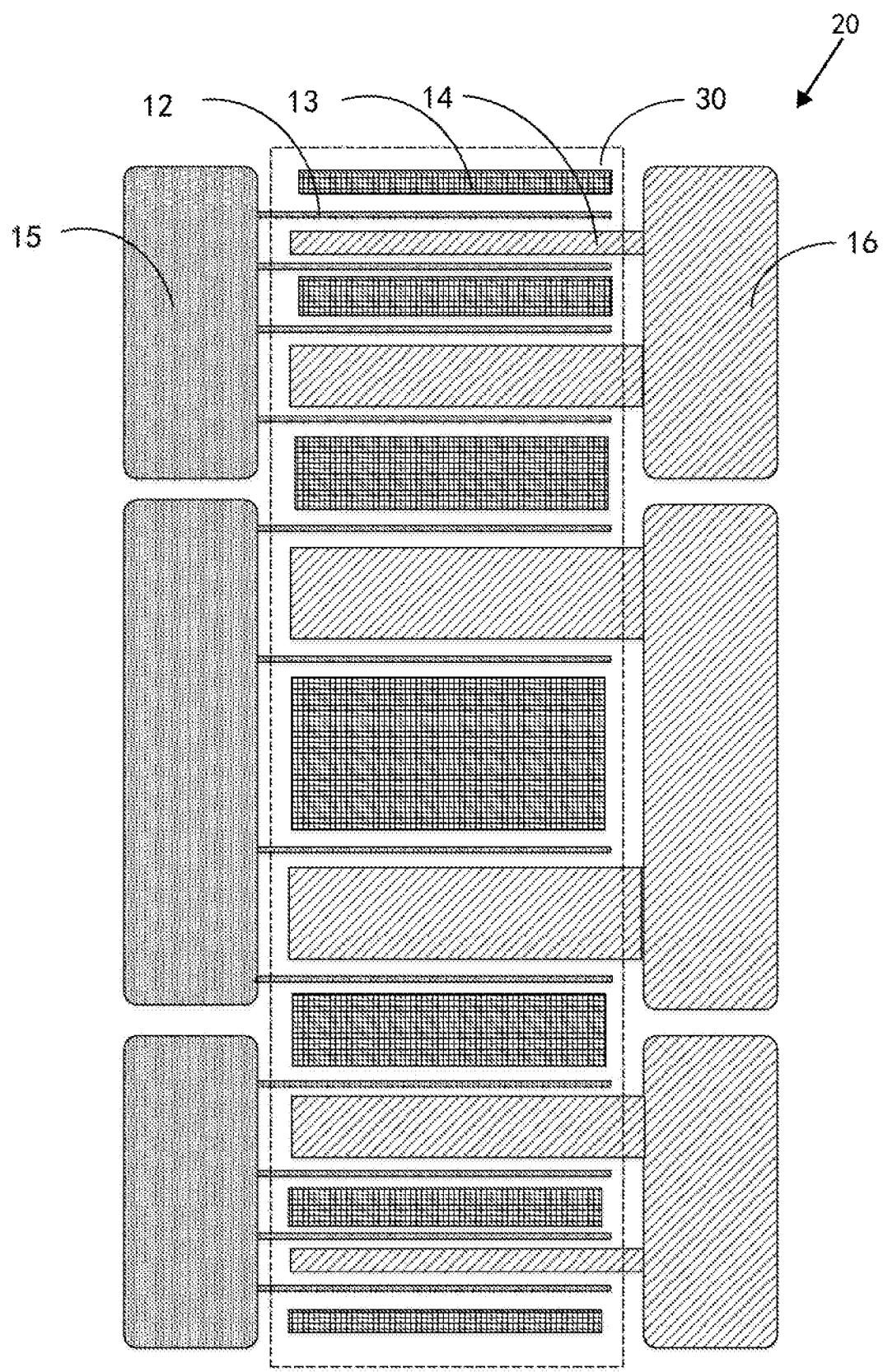
FIG. 7 is a top view of a semiconductor chip provided by Embodiment five of the present disclosure.

FIG. 7 is a top view of a semiconductor chip provided by Embodiment five of the present disclosure. The semiconductor chip 20 includes a plurality of semiconductor devices 10 which are connected in parallel. Each semiconductor device 10 includes a plurality of gates 12, a plurality of drains 14, and a plurality of sources 13, the gates 12 being located between the sources 13 and the drains 14. Therein, in the semiconductor chip 20, a gate pitch is formed between any two adjacent gates 12, the formed respective gate pitches include at least two unequal gate pitches, the maximum gate pitch of the respective gate pitches is within a first preset range determined according to a pitch of two gates 12 at the two outermost ends in the semiconductor chip 20 in the gate length direction and a total number of gates 12 of the semiconductor chip 20.

Figure 8:
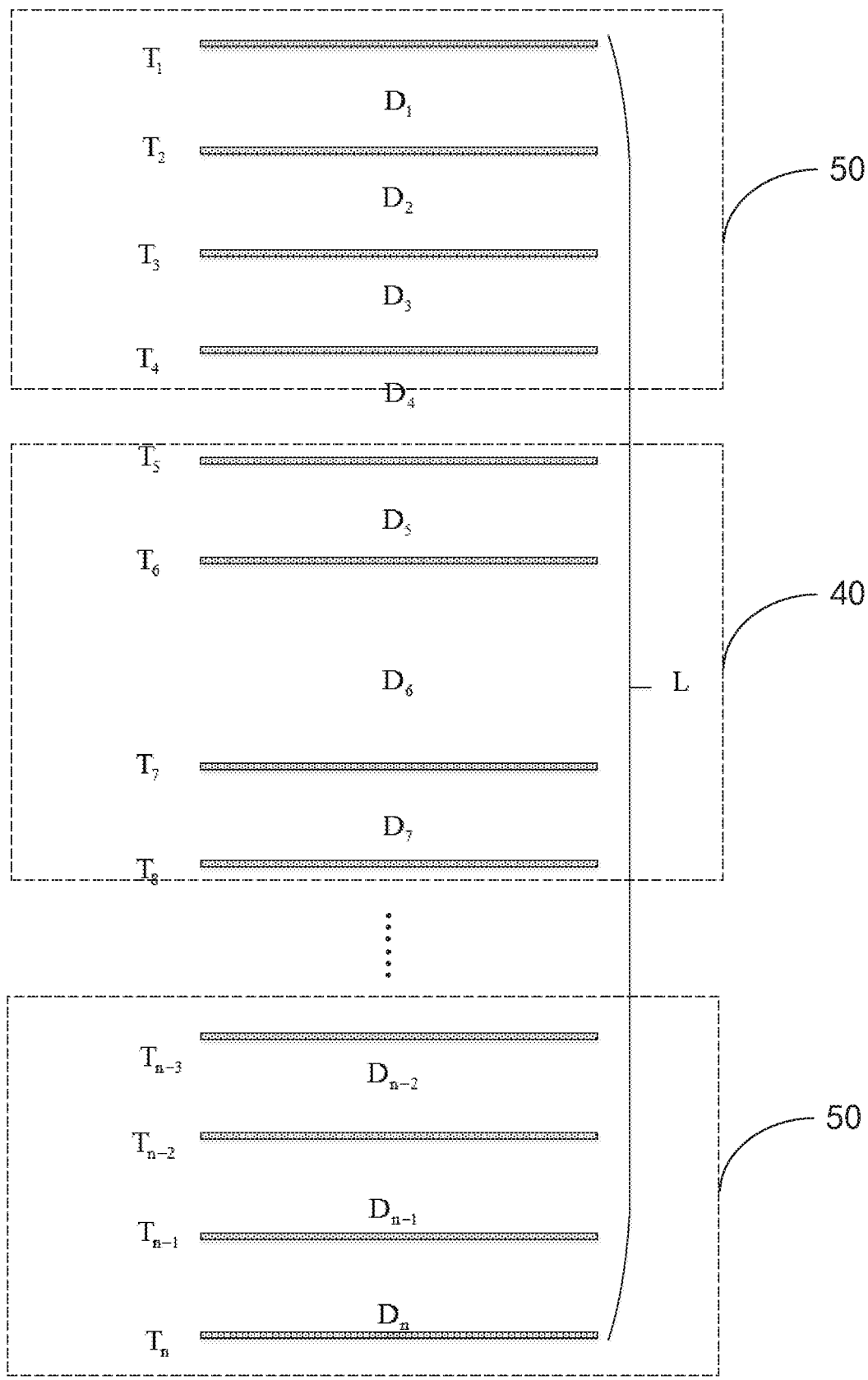
FIG. 8 is a schematic diagram of changes of the gate pitches in the semiconductor chip in Embodiment five of the present disclosure.

Specifically, as shown in FIG. 8, assuming that the pitch of two gates 12 at the two outermost ends in the semiconductor device 20 in the gate length direction is L and the total number of gates 12 of the semiconductor device 20 is n, the first preset range satisfies (L/(n−1), L), that is, the maximum gate pitch $L_{max}$ in the semiconductor device 20 satisfies $$\frac{L}{n-1} < L_{max} < L.$$

Alternatively, in actual implementation, the minimum gate pitch $L_{min}$ of the gate pitches satisfies $$\frac{L}{(n-1)^2} < L_{min} < \frac{L}{n-1}.$$

By setting the gate pitch in the semiconductor chip 20, the heat dissipation performance of the semiconductor chip 20 may be effectively improved while maintaining the overall size and output power of the chip.

Figure 9:
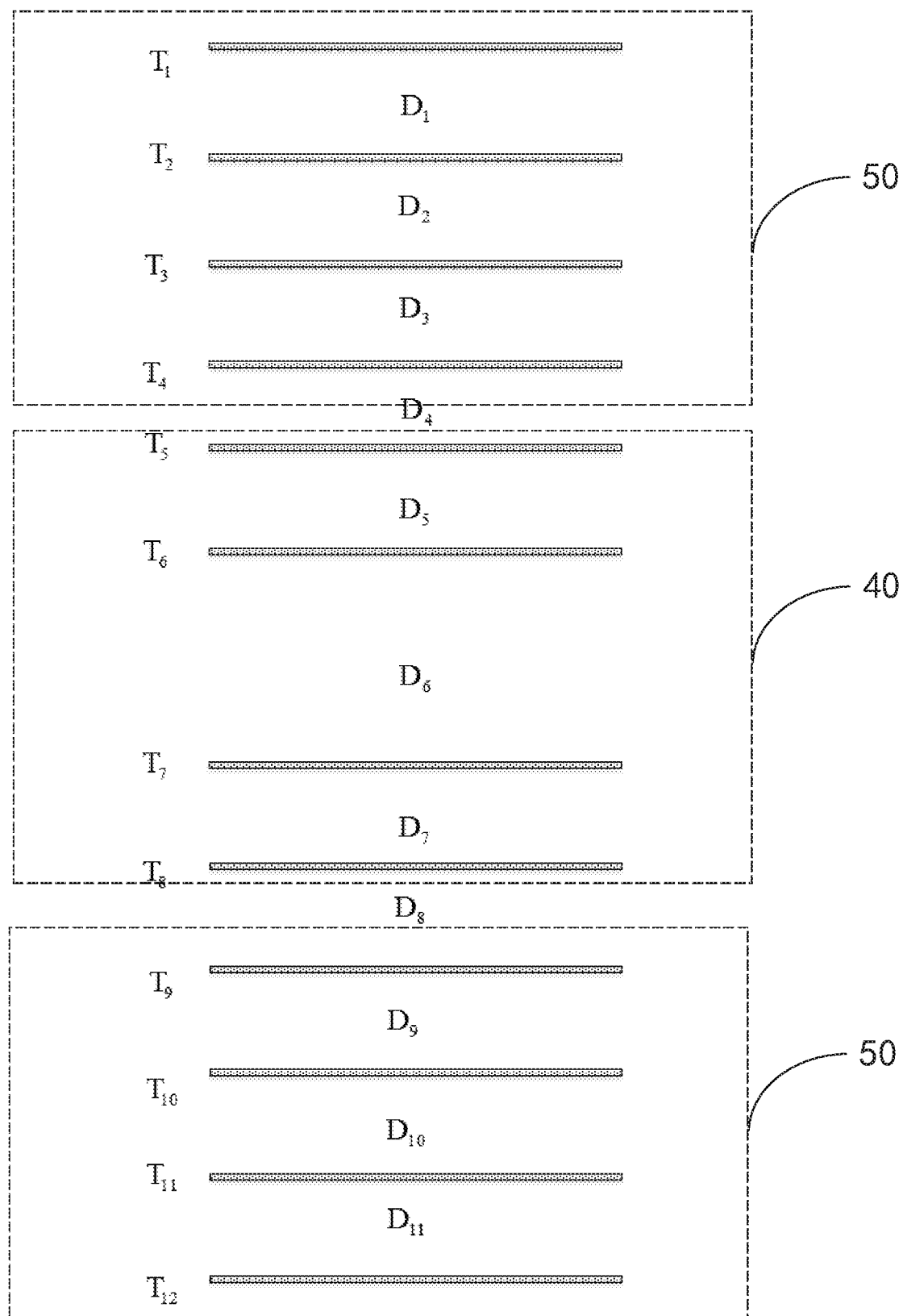
FIG. 9 is another schematic diagram of changes of the gate pitches in the semiconductor chip in Embodiment five of the present disclosure.

Compared with the above-mentioned Embodiment three, Embodiment five is different in that in the plurality of semiconductor devices 10 in the semiconductor chip 20 given in this embodiment, all the gate pitches in at least one semiconductor device 10 are equal. For instance, as shown in FIG. 9, assuming that the semiconductor chip 20 includes three semiconductor devices 10, which are one center device 40 and two edge devices 50 on both sides of the central device 40, respectively, all the gate pitches in the respective edge devices 50 may be equal, such as $D_1=D_2=D_3$, $D_9=D_{10}=D_{11}$, and so on. It should be noted that, in addition to this, in this embodiment, the structure of each semiconductor device 10 in the above-mentioned semiconductor chip 20 may also refer to the specific description of each gate pitch of the semiconductor device 10 in the above-mentioned Embodiment one; for instance, in the plurality of gate pitches formed by the plurality of gates 12, in a direction from the center position of the active region 30 of the semiconductor chip 20 to a position away from the center position, the respective gate pitches decrease sequentially according to a fixed value or a change amount, etc. This embodiment will not repeat them here specifically.

Compared with Embodiment three, this embodiment also provides that the edge gate pitches between a plurality of adjacent semiconductor devices 10 in the semiconductor chip 20 are equal or decrease from the center of the active region 30 to both ends. As an example form, the gate pitches in the plurality of semiconductor devices 10 in the semiconductor chip 20 are distributed at equal intervals, and the edge gate pitches between adjacent semiconductor devices 10 are not equal to the gate pitches in the semiconductor device 10. The gate pitch in the plurality of semiconductor devices 10 is the minimum gate pitch $L_{min}$, and the edge gate pitch between adjacent semiconductor devices 10 is the maximum pitch $L_{max}$, and the edge gate pitches between a plurality of adjacent semiconductor devices 10 are equal or the edge gate pitches between adjacent semiconductor devices 10 decrease from the center of the active region 30 to both sides.

Figure 10:
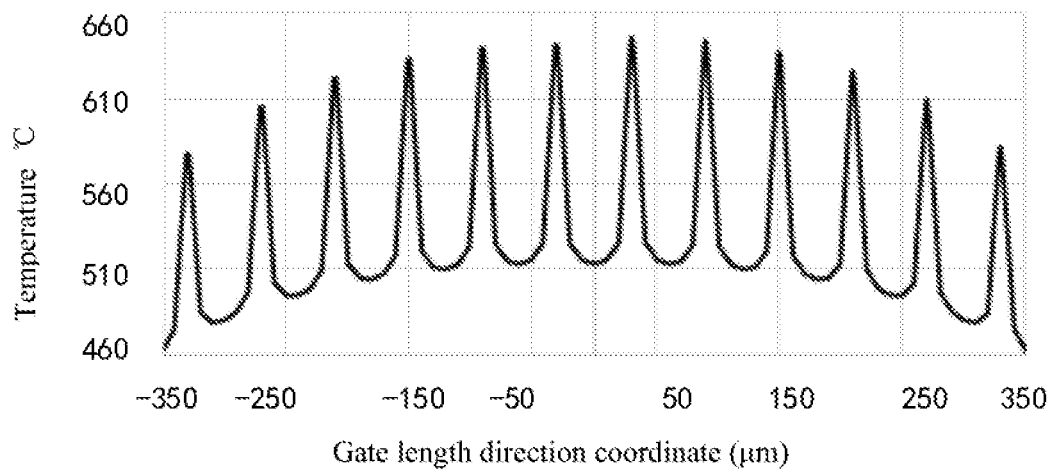
FIG. 10 is a schematic diagram of a simulation result after performing temperature simulation on a semiconductor chip in the prior art.
Figure 11:
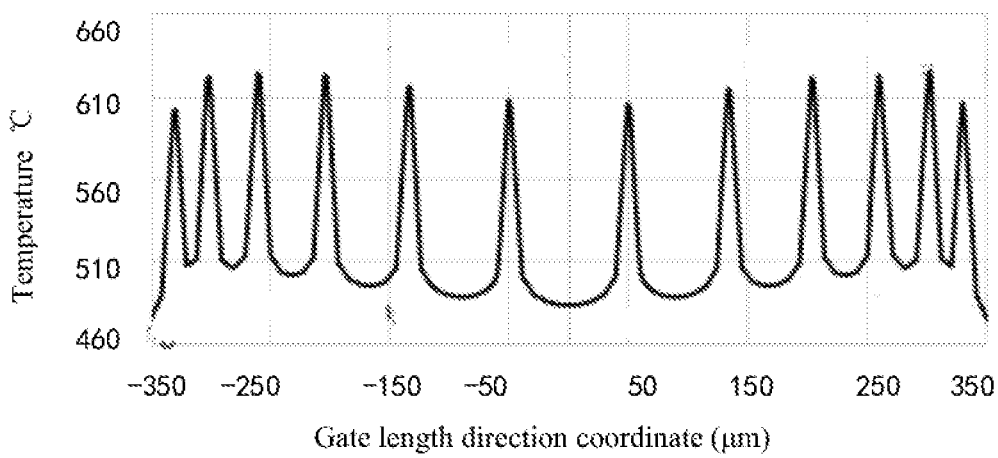
FIG. 11 is another schematic diagram of a simulation result after performing temperature simulation on a semiconductor chip provided by an embodiment of the present disclosure.

Further, based on the design and description of the semiconductor device 10 and the semiconductor chip 20 described above, the present disclosure takes the semiconductor chip 20 as shown in FIG. 5 as an example to perform a thermal simulation setting experiment on the semiconductor chip 20. As shown in FIGS. 10 and 11, the experimental results show that while fixing the positions of the two outermost gates 12 in the semiconductor chip 20, the gate pitches between the respective gates 12 are adjusted, which can cause the maximum temperature $T_{max}$ and the minimum temperature $T_{min}$ in the semiconductor chip 20 to change accordingly. Therein, when the gate pitches between adjacent gates 12 are equal (where the semiconductor chip 20 with the same gate pitches are equal is of the structure of the semiconductor chip 20 in the prior art), as shown in FIG. 10, in such a device structure with the same gate pitches, the difference between the maximum temperature $T_{max}$ and the minimum temperature $T_{min}$ of the device is great, and the temperature distribution of the device is not uniform, and at the time ΔT value is relatively great. However, as shown in FIG. 11, in the embodiment of the present disclosure, by adjusting the gate pitches, the lowest ΔT value can be changed and obtained, and problems such as degradation of the radio frequency performance of the semiconductor device 10 due to the structure of the equally-spaced gate pitches in the prior art may be effectively avoided.

Embodiment Six

Embodiment six of the present disclosure also provides a method of manufacturing a semiconductor device 10. The method of manufacturing the semiconductor device 10 will be described below in conjunction with specific steps.

At step S100, a substrate is provided.

Therein, the material of the substrate is as described above, and will not be repeated here. The method of forming the substrate may include Chemical Vapor Deposition, (CVD), Vapour Phase Epitaxy (VPE), Metal-organic Chemical Vapor Deposition (MOCVD), Low Pressure Chemical Vapor Deposition (LPCVD), Plasma Enhanced Chemical Vapor Deposition (PECVD), Pulsed Laser Deposition (PLD), atomic layer epitaxy, Molecular Beam Epitaxy (MBE), sputtering, evaporation, etc., which will not be limited in this embodiment specifically.

At step S200, a semiconductor layer 11 is formed on a side of the substrate.

The method of forming the semiconductor layer 11 on the substrate may include, but is not limited to, the method of forming the substrate, in other words, the method of forming the semiconductor layer 11 may be the same as or different from the method of forming the substrate.

At step S300, a plurality of gates 12, a plurality of drains 14, and a plurality of sources 13 are formed on a side of the semiconductor layer 11 away from the substrate, each gate 12 being located between one of the sources 13 and one of the drains 14, and the gates 12, sources 13, and drains 14 being located in an active region 30 of the semiconductor device 10. Therein, a gate pitch is formed between any two adjacent gates 12, the maximum gate pitch of the respective gate pitches is within a first preset range determined according to a pitch of two gates 12 at the two outermost ends in the semiconductor device 10 in the gate length direction and a total number of gates 12 of the semiconductor device 10.

In addition, the first preset range is (L/(n−1), L), the minimum gate pitch of the respective gate pitches is within a second preset range determined according to a pitch of two gates 12 at the two outermost ends in the semiconductor device 10 in the gate length direction and a total number of gates 12 of the semiconductor device 10, the second preset range is (L/(n−1)², L/(n−1)), where L is the pitch of two gates 12 at the two outermost ends in the semiconductor device 10 in the gate length direction, and n is the total number of gates 12 of the semiconductor device 10.

In summary, the present disclosure provides a semiconductor device 10, a semiconductor chip 20, and a method of manufacturing a semiconductor device 10, wherein, by adjusting the gate pitches between adjacent gates 12 in the semiconductor device 10 without increasing the volume of the semiconductor device 10, the temperature distribution during the use of the semiconductor device 10 is more uniform, which reduces the device heat loss and increase the output power thereof. Meanwhile, the structure in the embodiments of the present disclosure is simple, easy to manufacture, and suitable for large-scale promotion.

Obviously, those skilled in the art should understand that the functions of the embodiments of the present disclosure described above may be implemented by a general-purpose computing device, they may be concentrated on a single computing device, or distributed on a network composed of a plurality of computing devices, alternatively, they may be implemented with existing program codes or algorithms executable by a computing device, thus they may be stored in a storage device and executed by a computing device, or they may be made into individual integrated circuit modules, or a plurality of modules or steps in them may be made into a single integrated circuit module for implementation. In this way, the functional implementation of the present disclosure is not limited to any specific combination of hardware and software.

The above are only example embodiments of the present disclosure and are not intended to limit the present disclosure. For those skilled in the art, the present disclosure may have various modifications and changes. Any modification, equivalent replacement, improvement, etc. made within the spirit and principle of the present disclosure should be included in the protection scope of the present disclosure.

What is claimed is:

1. A semiconductor device comprising:
a substrate;
a semiconductor layer formed on the substrate; and
a plurality of gates, a plurality of drains, and a plurality of sources formed on a side of the semiconductor layer away from the substrate, the gates located between the sources and the drains, and the gates, sources, and drains located in an active region of the semiconductor device;
wherein a gate pitch is formed between any two adjacent gates, wherein the formed respective gate pitches include at least two unequal gate pitches, and wherein a maximum gate pitch of the respective gate pitches is within a first preset range determined according to a pitch of two gates at two outermost ends in the semiconductor device in a gate length direction and a total number of gates of the semiconductor device, and
wherein the maximum gate pitch is located between adjacent gates on both sides of a corresponding source, and wherein a minimum gate pitch of the respective gate pitches is located between adjacent gates on both sides of a corresponding drain.

2. The semiconductor device according to claim 1, wherein the first preset range is (L/(n−1), L), and wherein the maximum gate pitch $L_{max}$ satisfies the following condition, $$\frac{L}{n-1} < L_{max} < L$$

wherein L is the pitch of two gates at the two outermost ends in the semiconductor device in the gate length direction, and wherein n is the total number of gates of the semiconductor device.

3. The semiconductor device according to claim 1, wherein the minimum gate pitch of the respective gate pitches is within a second preset range determined according to the pitch of two gates at the two outermost ends in the semiconductor device in the gate length direction and the total number of gates of the semiconductor device, wherein the second preset range is (L/(n−1)², L/(n−1)), and wherein the minimum gate pitch $L_{min}$ satisfies the following condition, $$\frac{L}{(n-1)^2} < L_{min} < \frac{L}{n-1}$$

wherein L is the pitch of two gates at the two outermost ends in the semiconductor device in the gate length direction, and wherein n is the total number of gates of the semiconductor device.

4. The semiconductor device according to claim 3, wherein the maximum gate pitch is located at a center position of the active region, while other gate pitches are sequentially arranged in a direction from the center position of the active region to a position away from the center position, and wherein all the other gate pitches are minimum gate pitches.

5. The semiconductor device according to claim 1, wherein, in a direction from a center position of the active region to a position away from the center position, the respective pitches between adjacent gates on both sides of the corresponding source decrease sequentially according to a first fixed value or a first change amount, and wherein the respective pitches between adjacent gates on both sides of the corresponding drain decrease sequentially according to a second fixed value or a second change amount.

6. The semiconductor device according to claim 1, wherein a plurality of the gates are interconnected together through a gate pad located in a passive region of the semiconductor device, wherein a plurality of the drains are interconnected together through a drain pad located in the passive region, and wherein a plurality of the sources are respectively connected to a ground electrode located on a side of the substrate away from the semiconductor layer respectively through a plurality of through holes penetrating the substrate and the semiconductor layer.

7. The semiconductor device according to claim 1, wherein the respective gate pitches include at least two gate pitches which are the maximum gate pitch.

8. The semiconductor device according to claim 7, wherein the maximum gate pitch is located at a center position of the active region, and in a direction from the center position of the active region to a position away from the center position, and wherein two pitches of the maximum gate pitch and the minimum gate pitch are arranged alternately.

9. A semiconductor chip, wherein the semiconductor chip comprises a plurality of semiconductor devices according to claim 1, and wherein the plurality of semiconductor devices are connected in parallel.

10. The semiconductor chip according to claim 9, wherein a gate pitch between devices is formed between edge gates of any two adjacent semiconductor devices, and in a direction from a center position of the active region of the semiconductor chip to a position away from the center position, and wherein the gate pitches between devices decrease sequentially according to a third fixed value or a third change amount.

11. The semiconductor chip according to claim 10, wherein the third fixed value or the third change amount is less than or equal to twice of the maximum gate pitch inside the semiconductor devices in the semiconductor chip.

12. The semiconductor chip according to claim 9, wherein a plurality of the plurality of semiconductor devices includes a center device located at a center of the active region and an edge device away from the center of the active region, and wherein a center gate pitch of the edge device is different from an edge gate pitch of the center device;
wherein the center gate pitch of the edge device is a gate pitch formed by two adjacent gates located at a center of the edge device, and wherein the edge gate pitch of the center device is a gate pitch formed by any two adjacent gates away from a center of the center device.

13. The semiconductor chip according to claim 12, wherein the center gate pitch of the center device is different from the center gate pitch of the edge device.

14. A semiconductor chip comprising a plurality of semiconductor devices, the plurality of semiconductor devices connected in parallel, each semiconductor device comprising a plurality of gates, a plurality of drains, and a plurality of sources, the gates located between the sources and the drains;

wherein, in the semiconductor chip, a gate pitch is formed between any two adjacent gates, wherein the formed respective gate pitches include at least two unequal gate pitches, and wherein a maximum gate pitch of the respective gate pitches is within a first preset range determined according to a pitch of two gates at two outermost ends in the semiconductor chip in a gate length direction and a total number of gates of the semiconductor chip, and wherein the maximum gate pitch is located between adjacent gates on both sides of a corresponding source, and wherein a minimum gate pitch of the respective gate pitches is located between adjacent gates on both sides of a corresponding drain.

15. The semiconductor chip according to claim 14, wherein in a plurality of the plurality of semiconductor devices, all gate pitches in at least one semiconductor device are equal.

16. The semiconductor chip according to claim 14, wherein edge gate pitches between a plurality of adjacent semiconductor devices are equal or decrease from a center of an active region to both ends.

17. The semiconductor chip according to claim 14, wherein a pitch between gates on both sides of a source inside at least one semiconductor device of the plurality of semiconductor devices is d1, and wherein a pitch between gates on both sides of a drain inside the at least one semiconductor device is d2, where d2≤d1≤2d2.

18. A method of manufacturing a semiconductor device, the method comprising:
providing a substrate;
forming a semiconductor layer on a side of the substrate; and
forming a plurality of gates, a plurality of drains, and a plurality of sources on a side of the semiconductor layer away from the substrate, each gate located between one of the sources and one of the drains, and the gates, sources, and drains located in an active region of the semiconductor device;

wherein a gate pitch is formed between any two adjacent gates, wherein the formed respective gate pitches include at least two unequal gate pitches, and wherein a maximum gate pitch of the respective gate pitches is within a first preset range determined according to a pitch of two gates at two outermost ends in the semiconductor device in a gate length direction and a total number of gates of the semiconductor device, and wherein the maximum gate pitch is located between adjacent gates on both sides of a corresponding source, and wherein a minimum gate pitch of the respective gate pitches is located between adjacent gates on both sides of a corresponding drain.

19. The method of manufacturing a semiconductor device according to claim 18, wherein the first preset range is (L/(n−1), L), and wherein the maximum gate pitch $L_{max}$ satisfies the following condition, $$\frac{L}{n-1} < L_{max} < L$$

wherein the minimum gate pitch of the respective gate pitches is within a second preset range determined according to the pitch of two gates at the two outermost ends in the semiconductor device in the gate length direction and the total number of gates of the semiconductor device, wherein the second preset range is (L/(n−1)², L/(n−1)), and wherein the minimum gate pitch $L_{min}$ satisfies the following condition, $$\frac{L}{(n-1)^2} < L_{min} < \frac{L}{n-1}$$

wherein L is the pitch of two gates at the two outermost ends in the semiconductor device in the gate length direction, and wherein n is the total number of gates of the semiconductor device.

* * * * *